United States Patent
Booth

(10) Patent No.: US 9,997,908 B2
(45) Date of Patent: Jun. 12, 2018

(54) CIRCUIT FOR A VOLTAGE POWER OPTIMISER

(71) Applicant: Intelligent Energy Saving Company Limited, London (GB)

(72) Inventor: Roy Booth, London (GB)

(73) Assignee: INTELLIGENT ENERGY SAVING COMPANY LIMITED, London (GB)

( * ) Notice: Subject to any disclaimer, the term of this patent is extended or adjusted under 35 U.S.C. 154(b) by 0 days. days.

(21) Appl. No.: 15/536,770

(22) PCT Filed: Dec. 16, 2015

(86) PCT No.: PCT/GB2015/054037
§ 371 (c)(1),
(2) Date: Jun. 16, 2017

(87) PCT Pub. No.: WO2016/097727
PCT Pub. Date: Jun. 23, 2016

(65) Prior Publication Data
US 2017/0358923 A1    Dec. 14, 2017

(30) Foreign Application Priority Data
Dec. 17, 2014    (GB) .................................. 1422450.5

(51) Int. Cl.
*G05F 1/70* (2006.01)
*H02H 9/04* (2006.01)
(Continued)

(52) U.S. Cl.
CPC ............ *H02H 9/041* (2013.01); *H02H 3/066* (2013.01); *H02M 1/083* (2013.01); *H02M 1/32* (2013.01);
(Continued)

(58) Field of Classification Search
CPC .......... H02M 1/08; H02M 1/32; H02M 1/083; H02M 5/293; H02H 9/04; H02H 9/041;
(Continued)

(56) References Cited

U.S. PATENT DOCUMENTS 3,878,451 A    4/1975    Ostlund et al.
4,217,618 A    8/1980    Kellenbenz et al.
(Continued)

FOREIGN PATENT DOCUMENTS

GB    2073919 A    10/1981

OTHER PUBLICATIONS

PCT/ISR/210 Search Report dated Feb. 26, 2016 (pp. 2).
Search report from Great Britain counterpart Appln No. GB1422450.5 dated Jun. 19, 2015.

*Primary Examiner* — Yemane Mehari
(74) *Attorney, Agent, or Firm* — Tutunjian & Bitetto, P.C.

(57) ABSTRACT

A controller protection circuit for a voltage power optimizer. The circuit having: a first terminal for connecting to a first end of a winding in the voltage power optimizer; a second terminal for connecting to a second end of the winding in the voltage power optimizer; and a thyristor. The controller protection circuit also includes a thyristor gate control circuit. The thyristor gate control circuit is configured to: set the gate control signal such that the thyristor is configured to conduct in response to a potential difference between the anode terminal and the cathode terminal of the thyristor; and set the gate control signal such that the thyristor is configured not to conduct in response to a signal received from a voltage controller. The thyristor gate control circuit includes a normally-on switch having a conduction channel and a control terminal; and a photovoltaic isolator configured to
(Continued)

set the gate control signal such that the thyristor is configured not to conduct in response to a signal received from a voltage controller.

17 Claims, 4 Drawing Sheets

(51) Int. Cl.
| | |
|---|---|
| *H02H 3/06* | (2006.01) |
| *H02M 1/08* | (2006.01) |
| *H02M 5/293* | (2006.01) |
| *H02M 1/32* | (2007.01) |
| *H03K 17/13* | (2006.01) |
| *H03K 17/284* | (2006.01) |
| *H03K 17/687* | (2006.01) |

(52) U.S. Cl.
CPC .......... *H02M 5/293* (2013.01); *H03K 17/133* (2013.01); *H03K 17/284* (2013.01); *H03K 17/6874* (2013.01)

(58) Field of Classification Search
CPC .......... H02H 3/06; H02H 3/066; H03K 17/13; H03K 17/133; H03K 17/284; H03K 17/687; H03K 17/6874; G05F 1/70
USPC .................................................. 323/205–219
See application file for complete search history.

(56) References Cited

U.S. PATENT DOCUMENTS

| | | |
|---|---|---|
| 4,896,092 A | 1/1990 | Flynn |
| 4,931,778 A | 6/1990 | Guajardo |
| 2011/0148505 A1 | 6/2011 | Klapatch |
| 2012/0280665 A1 | 11/2012 | Su et al. |
| 2014/0177308 A1 | 6/2014 | Morita |

CIRCUIT FOR A VOLTAGE POWER OPTIMISER

The present disclosure relates to a circuit for a voltage power optimiser (VPO), and in particular to a circuit for protecting a controller in a VPO from high voltages that may build up across a winding in a VPO.

Electrical distribution networks are designed to supply electricity at a voltage that lies within a tolerance band of a chosen voltage. This allows for fluctuations in demand, available generating capacity and losses within the distribution network. In the United Kingdom, for example, the target voltage is 230 Vac, although the actual voltage supplied can be within +/−10% of this target.

Electrical equipment can be designed to operate optimally at the target voltage. Operation at a voltage above or below the target can lead to a reduction in efficiency and hence wasted energy. Some consumers can install and utilise localised voltage regulation equipment.

According to a first aspect of the invention, there is provided a controller protection circuit for a voltage power optimiser, the circuit comprising:
- a first terminal for connecting to a first end of a winding in the voltage power optimiser;
- a second terminal for connecting to a second end of the winding in the voltage power optimiser;
- a thyristor having an anode terminal, a cathode terminal and a gate terminal, wherein the anode terminal is connected to the first terminal, and the cathode terminal is connected to the second terminal, wherein the gate terminal is configured to receive a gate control signal;
- a thyristor gate control circuit, the thyristor gate control circuit configured to:
  - set the gate control signal such that the thyristor is configured to conduct in response to a potential difference between the anode terminal and the cathode terminal of the thyristor; and
  - set the gate control signal such that the thyristor is configured not to conduct in response to a signal received from a voltage controller.

The thyristor gate control circuit may comprise:
- a normally-on switch having a conduction channel and a control terminal, wherein the conduction channel is connected in series between the anode terminal and the gate terminal of the thyristor; and/or
- a galvanically isolated signal transmission device configured to set the gate control signal such that the thyristor is configured not to conduct in response to a signal received from a voltage controller.

The normally-on switch may be a depletion mode MOSFET. The galvanically isolated signal transmission device may be a photo-voltaic isolator.

The galvanically isolated signal transmission device may be configured to provide a voltage signal to the control terminal of the normally-on switch such that:
- the normally-on switch is switched off; and
- the gate control signal is set such that the thyristor is configured not to conduct.

The thyristor gate control circuit may comprise one or both of a first diode and a first resistor in series with the normally-on switch, between the anode terminal and the gate terminal of the thyristor.

The first resistor may comprise: a first terminal connected to the gate terminal of the thyristor; and a second terminal connected to the conduction channel of the normally-on switch.

The thyristor gate control circuit may further comprise a second resistor. The second resistor may comprise: a first terminal connected to the first terminal of the first resistor; and a second terminal connected to the control terminal of the normally-on switch.

The controller protection circuit may further comprise an opto-coupler, which comprises an LED and an opto-transistor. The conduction channel of the opto-transistor may be connected in parallel with the output of the galvanically isolated signal transmission device. The opto-transistor may be configured to short the output of the galvanically isolated signal transmission device in response to light received from the LED.

The controller protection circuit may further comprise a high-voltage override circuit that is configured to set the gate control signal such that the thyristor is switched on if the voltage across the thyristor exceeds a threshold value. The controller protection circuit may further comprise a normally-off switch having a conduction channel. The conduction channel may be connected in parallel with the output of the galvanically isolated signal transmission device. The conduction channel may be configured to conduct when the voltage across the thyristor exceeds a threshold value.

The controller protection circuit may further comprise an over-voltage signalling circuit that is configured to generate a warning signal in response to the threshold value being exceeded. The over-voltage signalling circuit may comprise a second galvanically isolated signal transmission device.

The controller protection circuit may further comprise a second thyristor having a second anode terminal, a second cathode terminal and a second gate terminal. The second anode terminal may be connected to the second terminal. The second cathode terminal may be connected to the first terminal. The second gate terminal may be configured to receive a second gate control signal. The controller protection circuit may also comprise a second thyristor gate control circuit. The second thyristor gate control circuit may be configured to:
- set the second gate control signal such that the second thyristor is configured to conduct in response to a potential difference between the second anode terminal and the second cathode terminal of the second thyristor; and
- set the second gate control signal such that the second thyristor is configured not to conduct in response to a signal received from the voltage controller.

There is also provided a voltage power optimiser circuit, comprising:
- an input terminal;
- an output terminal;
- a voltage regulating transformer comprising a controlled winding and an output winding, wherein the output winding is connected in series between the input terminal and the output terminal, and wherein the controlled winding has a first end and a second end;
- a controller connected to the first end and to the second end of the controlled winding; and
- any controller protection circuit disclosed herein connected between the first end and the second end of the controlled winding.

There is also provided a three-phase voltage power optimiser circuit, comprising:
- three input terminals;
- three output terminals;
- three voltage regulating transformers, each voltage regulating transformer comprising a controlled winding and an output winding, wherein each output winding is connected in series between respective ones of the input terminals and the output terminals, and wherein each controlled winding has a first end and a second end, wherein the first ends of each of the controlled windings are connected together to form a star-point;

a controller connected to the first end of each of the controlled windings; and a first controller protection circuit comprising any controller protection circuit disclosed herein, wherein the first controller protection circuit is connected between the second ends of a first pair of the controlled windings; and a second controller protection circuit comprising any controller protection circuit disclosed herein, wherein the second controller protection circuit is connected between the second ends of a second, different, pair of the controlled windings.

There is also provided a three-phase voltage power optimiser circuit, comprising:

three input terminals;

three output terminals;

three voltage regulating transformers, each voltage regulating transformer comprising a controlled winding and an output winding, wherein each output winding is connected in series between respective ones of the input terminals and the output terminals, and wherein each controlled winding has a first end and a second end;

a dual mode controller comprising a first sub-controller and a second sub-controller, wherein the first sub-controller is connected to the first end of each of the controlled windings, and wherein the second sub-controller is connected to the second end of each of the controlled windings; and a first controller protection circuit comprising any controller protection circuit disclosed herein, wherein the first controller protection circuit is connected between the first ends of a first pair of the controlled windings;

a second controller protection circuit comprising any controller protection circuit disclosed herein, wherein the second controller protection circuit is connected between the first ends of a second, different, pair of the controlled windings;

a third controller protection circuit comprising any controller protection circuit disclosed herein, wherein the third controller protection circuit is connected between the second ends of a first pair of the controlled windings; and a fourth controller protection circuit comprising any controller protection circuit disclosed herein, wherein the fourth controller protection circuit is connected between the second ends of a second, different, pair of the controlled windings.

The dual mode controller may be configured to activate only one of the first sub-controller and the second sub-controller at an instant time. The inactive sub-controller may be configured to set the gate control signal for the associated thyristors such that they are configured to conduct and thereby define a star-point between the associated ends of the controlled windings.

The first sub-controller may be a buck chopper controller. The second sub-controller may be a boost chopper controller.

There may be provided a computer program, which when run on a computer, causes the computer to configure any apparatus, including a controller, system, or device disclosed herein or perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

Embodiments of the present invention will now be described by way of example and with reference to the accompanying drawings in which.

Example disclosed herein relate to a circuit for protecting a controller in a VPO from high voltages that may build up across a winding in a VPO. The circuit includes a thyristor that is powered by a potential difference across its anode and cathode terminals, and in this way can be operated as a self-powered normally-on switch.

Consumers of electricity can install a voltage reducing transformer, or voltage power optimiser. This equipment is especially useful where a supply voltage is generally stable and above a target voltage. Such transformers can be used to reduce the incoming voltage by a fixed but selectable proportion, for example 2%, 4% or 6%.

In applications where the supply voltage is expected to fluctuate, a more sophisticated approach can be used. One option is to use electro-mechanical voltage regulators. These can utilise a control system and electrical motors to move the position of an electrical contact on a transformer winding in order to maintain a relatively constant output voltage. This technology can suffer in terms of reliability as a result of mechanical wear to the moving contacts.

AC voltage regulators can also be used with silicon-controlled-rectifiers (thyristors) to switch between different transformer taps, thus maintaining a regulated output voltage but without requiring any moving parts. Although electronic tap-changing voltage regulators can be more reliable than electro-mechanical regulators, they may have only a small number of tap settings, for example to reduce cost. This impacts on the accuracy of the output voltage because it can only be varied by an amount that is related to the number of tap settings. For example, fixed steps of 5 volts or more may be available, which may not be accurate enough for some applications.

High-frequency pulse-width-modulated (PWM) ac voltage regulators can also be used. Such regulators can use insulated-gate-bipolar-transistors (IGBT's). IGBT PWM ac voltage regulators have the advantage of not using any moving parts but also the ability to maintain the output voltage very accurately, for example to better than 1%.

IGBT regulators can be designed to directly supply regulated voltage, or they can be used with a transformer. Use of a transformer can significantly reduce the size and cost of the power electronics and also can significantly improve the overall system efficiency.

Figure 1:
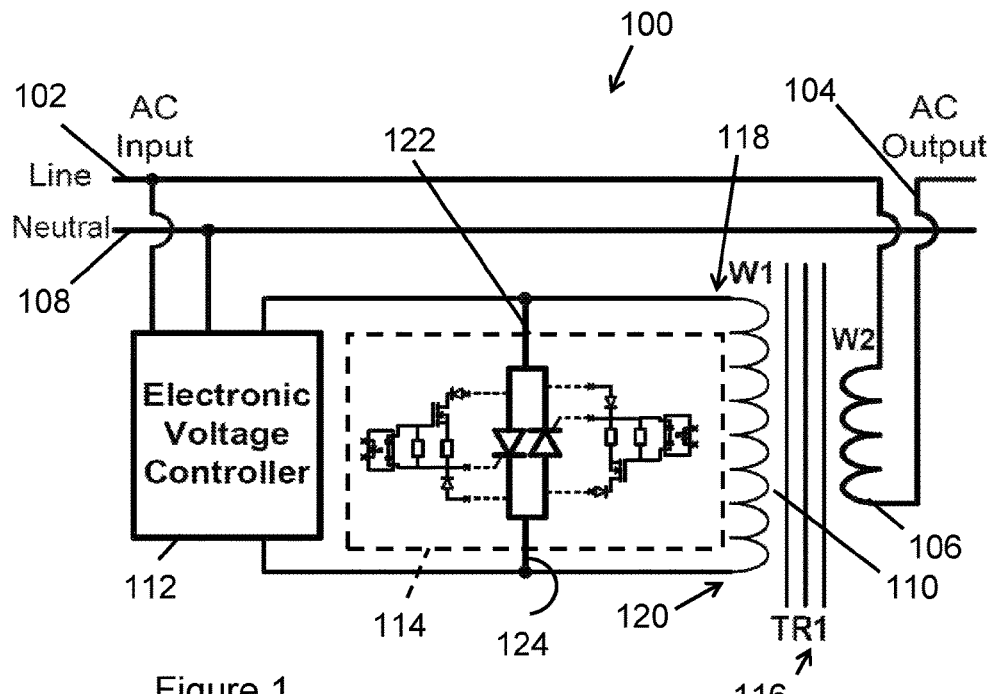
FIG. 1 illustrates a single-phase voltage power optimiser circuit, which includes a controller protection circuit.

FIG. 1 illustrates a single-phase voltage power optimiser (VPO) circuit 100. The voltage power optimiser circuit 100 includes an input terminal 102 that is configured to receive an AC input voltage signal, for example from a line conductor of a mains electricity supply. The voltage power optimiser circuit 100 also includes an output terminal 104 that is configured to provide a regulated AC output voltage signal, for example as an electricity supply to a commercial premises.

An output winding (W2) 106 is connected in series between the input terminal 102 and the output terminal 104. The output winding 106, which may be referred to as a voltage regulated winding, forms part of a voltage regulating transformer 116 with a controlled winding (W1) 110. The controlled winding 110 may also be referred to as a voltage controlling winding, and has a first end 118 and a second end 120.

An electronic voltage controller 112 is connected to the first end 118 and to the second end 120 of the controlled winding 110. The electronic voltage controller 112 can include power electronics that, during operation, will set the voltage across the controlled winding 110 such that it influences the voltage through the output winding 106 in such a way that the regulated AC output voltage signal at the output terminal 104 is at a desired level. Such control can be implemented in a number of ways, for example through use of a buck converter and/or a boost converter, as discussed in more detail below. The electronic voltage controller 112 may provide the functionality of an IGBT PWM ac voltage regulator.

FIG. 1 also shows a controller protection circuit 114 connected between the first end 118 and the second end 120 of the controlled winding 110. More particularly, the controller protection circuit 114 has a first terminal 122 that is connected to the first end 118 of the controlled winding 110, and has a second terminal 124 that is connected to the second end 120 of the controlled winding 110. In this way, the controller protection circuit 114 is connected in parallel with the controlled winding 110. As will be discussed in more detail below, the controller protection circuit 114 can provide a current path that allows current to circulate in the controlled winding 110 at times when a current is flowing in the output winding 116 and the electronic voltage controller 112 is not operational. Failure to provide this current path at such times can readily lead to the generation of destructively high voltages within the controlled winding 110. Such high voltages can be especially destructive for an electronic voltage controller 112 that includes an IGBT PWM converter. In particular, without the controller protection circuit 114, destructively high voltages may occur at initial power on and also during operation if a fault occurs within the electronic voltage controller 112. Therefore, the controller protection circuit 114 can protect the power electronics of a single-phase electronic voltage controller 112 from a voltage induced in the controlled winding 110 as a result of current flowing in the output winding 106. If a current path isn't provided across the controlled winding 110 then this voltage can become very high.

Figure 2:
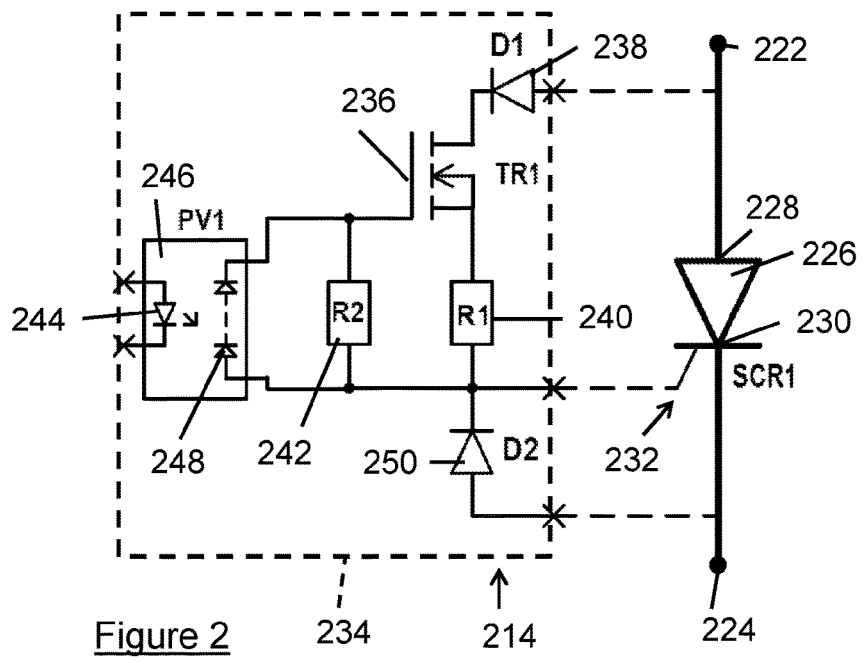
FIG. 2 shows an example of a controller protection circuit that can be used in the VPO circuit of FIG. 1, and represents half of the circuit of FIG. 3.
Figure 3:
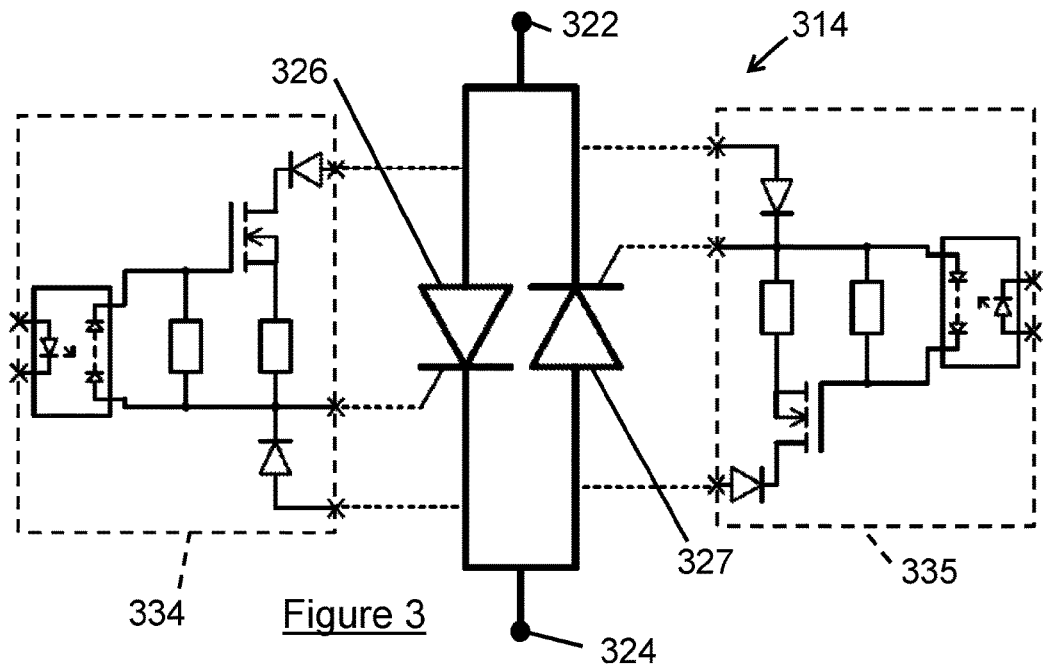
FIG. 3 illustrates a controller protection circuit that can protect against high voltages with either a negative or positive polarity.

FIG. 2 shows an example of a controller protection circuit 214 that can be used in the VPO circuit of FIG. 1. As will be described, the controller protection circuit 214 of FIG. 2 can protect against high voltages with only a single polarity (for example either positive or negative) across a winding. FIG. 3 illustrates a similar controller protection circuit that can protect against high voltages with either a negative or positive polarity, and will be described in more detail below.

Returning to FIG. 2, the controller protection circuit 214 includes a thyristor 226 connected between a first terminal 222 and a second terminal 224 of the controller protection circuit 214. In this example, the anode terminal 228 of the thyristor 226 is connected to the first terminal 222 and the cathode terminal 230 of the thyristor is connected to the second terminal 224. In this way, the thyristor 226 can be connected in parallel with a winding in a VPO circuit (not shown in FIG. 2). The thyristor 226 also has a gate terminal 232.

The controller protection circuit 214 includes a thyristor gate control circuit 234 that can set a gate control signal for the gate terminal 232 of the thyristor 226 such that the thyristor 226 is configured to conduct in response to the presence of a potential difference between the anode terminal 228 and the cathode terminal 230 of the thyristor 226. This potential difference should be higher than a threshold value for the thyristor 226 to be switched on. Advantageously, the implementation of FIG. 2 enables a low threshold to be used such that the thyristor 226 switches on quickly.

The thyristor gate control circuit 234 includes a high-voltage depletion mode MOSFET 236, which is an example of a first normally-on switch. The MOSFET 236 has a conduction channel between its drain and source terminals, and a gate terminal. The gate terminal is an example of a control terminal. The conduction channel of the MOSFET 236 is connected in series between the anode terminal 228 of the thyristor 226 and the gate terminal 232 of the thyristor 226. In this way, as soon as a current flows into the anode terminal 228 of the thyristor 226, it is communicated to the gate terminal 232 of the thyristor 226 through the conduction channel of the MOSFET 236 such that the thyristor 226 is switched on and is set to conduct. That is, the MOSFET 236 normally conducts current from the anode terminal 228 of the thyristor 226 into its gate terminal 232. This can be referred to as setting the gate control signal for the thyristor 226 such that the thyristor 226 is set to conduct. In this way, the thyristor 226 can be gated on whenever a voltage is applied across its main power terminals.

When the thyristor 226 is set to conduct, it provides a current flow path between the first terminal 222 and the second terminal 224. Therefore, when the controller protection circuit 214 is connected in parallel with a winding and an electronic voltage controller in a VPO circuit, it provides a circuit path that protects the electronic voltage controller from high voltages that could otherwise build up across the controlled winding in the VPO circuit.

The thyristor gate control circuit 234 in this example also includes a first diode (D1) 238 and a first resistor (R1) 240 that are in series with the MOSFET 236 between the anode terminal 228 and the gate terminal 230 of the thyristor 226. The first resistor 240 has a first terminal that is connected to the gate terminal 230 of the thyristor. The first resistor 240 also has a second terminal that is connected to the conduction channel of the MOSFET 236. The thyristor gate control circuit 234 also includes a second resistor (R2) 242. The second resistor 242 has a first terminal that connected to the first terminal of the first resistor 240. The second resistor 242 also has a second terminal connected to the gate terminal of the MOSFET 236.

The voltage drop across the first resistor 240 is coupled to the gate terminal of the MOSFET 236 via the second resistor 242. This can provide a gate control signal for the thyristor 226 that has a constant-current because, irrespective of the voltage applied across the thyristor's main power terminals (the anode terminal 228 and the cathode terminal 230) a current flowing in the first resistor 240 will produce a voltage drop that will pull the gate terminal of the MOSFET 236 negative with respect to its source terminal. An equilibrium condition can exist when the gate voltage of the MOSFET 236 is pulled towards its pinch-off voltage. Therefore, the level of the current that is provided to the gate terminal 232 of the thyristor 236 can be set by choosing a value for the first resistor 240 in accordance with the pinch-off point of the MOSFET 236.

The first diode 238 is connected such that its anode is connected to the anode terminal 228 of the thyristor 226, and its cathode is connected (indirectly in this example) to the gate terminal 232 of the thyristor 226. Therefore, if the thyristor 226 is reverse biased, then so is the first diode 238. In this way, the first diode 238 can prevent or reduce a reverse gate current being provided to the gate terminal 232 of the thyristor 226 when the voltage at the anode terminal 228 of the thyristor 226 is less than the voltage at the cathode terminal 230 of the thyristor 226, which can occur during a negative half of a mains cycle.

The thyristor gate control circuit 234 also includes an optional second diode (D2) 250. The second diode 250 is connected such that its anode is connected to the cathode terminal 230 of the thyristor 226, and its cathode is connected to the gate terminal 232 of the thyristor 226. The second diode 250 can provide protection from damage to the thyristor gate terminal 232 if the gate voltage ever becomes negative with respect to the cathode terminal.

It will be appreciated from the above discussion that the thyristor 226 can provide a short-circuit across a controlled winding in a VPO circuit in order to prevent a high voltage being developed across it when current is drawn through an output winding, either at initial power on or during a failure of the power electronics.

The thyristor gate control circuit 234 can also set the gate control signal such that the thyristor 226 is configured not to conduct in response to a signal received from an electronic voltage controller (not shown in FIG. 2). In this way, the thyristor 226 can be switched off for normal operation of the VPO circuit, which may be after start-up or after a fault has been repaired. In this example, once any power electronics are operational and capable of providing a current path for a controlled winding, the thyristor 226 can be disabled by energising one or more light emitting diodes (LEDs) 244 in a photo-voltaic isolator 246. If a fault subsequently occurs in the power electronics, then the thyristor 226 can be brought back into conduction by simply removing power from the inputs of the photo-voltaic isolator 246.

The thyristor gate control circuit 234 includes a photo-voltaic isolator 246 (which is an example of a galvanically isolated signal transmission device), which comprises an LED 244 and one or more photodiodes 248. When the LED 244 emits light it is received by the one or more photodiodes 248, and as a consequence the photodiodes 248 produce a current. The photo-voltaic isolator 246 can be considered as a controllable current source that is used to switch off the thyristor 226, in this example in response to a control signal that is galvanically isolated from the thyristor 226. The MOSFET 236 is normally-on by default, and the photo-voltaic isolator 246 can be used to override this behaviour.

The LED 244 is connected to an electronic voltage controller (not shown), such that the electronic voltage controller controls the operation of the LED 244. The electronic voltage controller can activate the LED 244 when there is sufficient power supplied to the electronic voltage controller, and when the supplied power is sufficiently stable. The power supplied may be insufficient or too unstable during initial startup and also during a fault condition. In some examples, the user may be provided with functionality to bypass the electronic voltage controller, in which case, the LED 244 may only be activated when a bypass mode has not been activated AND when the electronic voltage controller receives sufficiently stable power. The one or more photodiodes 248 are connected in series with each other, and are connected in parallel with the second resistor 242.

When the LED 244 is active, the one or more photodiodes 248 provide a current to the gate terminal of the MOSFET 236, which causes the MOSFET 236 to switch off. When the MOSFET 236 is switched off, the current that is provided to the gate terminal 232 of the thyristor 226 is removed or reduced and therefore the thyristor 226 is switched off. When the thyristor 226 is switched off, it no longer conducts a current from its anode terminal 228 to its cathode terminal 230. This mode of operation can be considered to be a normal mode of operation.

The output of the photo-voltaic isolator 246 can be used to drive the gate of the MOSFET 236 below its pinch-off voltage thus removing the gate drive current to the thyristor 226 whenever the LED 224 inside the photo-voltaic isolator 246 is energised. This can be referred to as setting the gate control signal such that the thyristor 226 is configured not to conduct in response to a signal received from the electronic voltage controller.

In some examples, the electronic voltage controller can also be used to operate the thyristor 226 in order to protect itself if a fault is detected. For example, if the power electronics in the electronic voltage controller identifies an internal fault, it can de-energise the photo-voltaic isolator 246 by removing power to the LED 244. In this way, the thyristor 226 can be used to provide a bypass across the transformer controlled winding and protect the electronic voltage controller. The photo-voltaic isolator 246 may take of the order of milliseconds, or hundreds of micro-seconds, to extinguish its output voltage. These timeframes can be acceptable in some examples.

FIG. 3 illustrates a controller protection circuit 314 that can protect against high voltages with either a negative or positive polarity. FIG. 3 includes a number of features that have already been described with reference to FIG. 2, and will not necessarily be described again here.

The controller protection circuit 314 includes a first thyristor 326 and second thyristor 327. The first thyristor 326 has an anode terminal connected to a first terminal 322 and a cathode terminal connected to a second terminal 324. The second thyristor 327 has an anode terminal connected to the second terminal 324 and a cathode terminal connected to the first terminal 322. In this way the first thyristor 326 and the second thyristor 327 are connected anti-parallel with each other between the first terminal 322 and the second terminal 324 in order to provide the functionality of a normally-closed switch that is capable of handling alternating current. This is because the thyristors 326, 327 can only conduct current in one direction.

FIG. 3 shows a first thyristor gate control circuit 334 for the first thyristor 326 and a second thyristor gate control circuit 335 for the second thyristor 327. The thyristor gate control circuits 334, 335 are the same as that described with reference to FIG. 2 and will not be described again here.

Circuits disclosed in this document can allow thyristors to be used to provide the current path for transformer windings without the need for additional gate trigger power supplies. This can be achieved by using a high-voltage depletion-mode MOSFET transistor, configured as a constant current source, to effectively turn on a thyristor gate whenever a voltage is present across the thyristor. A constant current source can be advantageous because the instantaneous voltage applied across the thyristor when the system is first energised can be anything from a few volts to a few hundred volts depending upon where in the mains cycle the power is applied.

A depletion-mode MOSFET conducts electricity without any gate voltage applied so is effectively a normally-closed contact. However, depletion-mode MOSFETs may not be available in both high-voltage and high-current ratings so they may not be suitable for use directly to provide the current path for the controlled transformer winding. However, a high-voltage low-current depletion-mode MOSFET can be used to provide the gate signal for a high-voltage, high-current capacity thyristor, which is readily available.

Using a depletion-mode MOSFET for this application can greatly simplify the implementation of the constant current source, can provide a normally closed operation without external power and may require only a minimal amount of gate current to turn off the MOSFET when the thyristor conduction needs to be stopped. The MOSFET gate current can be so small that it can be provided by the output of a photo-voltaic isolator, thus obviating the need for floating power supplies or complex gate drive circuitry.

Figure 4:
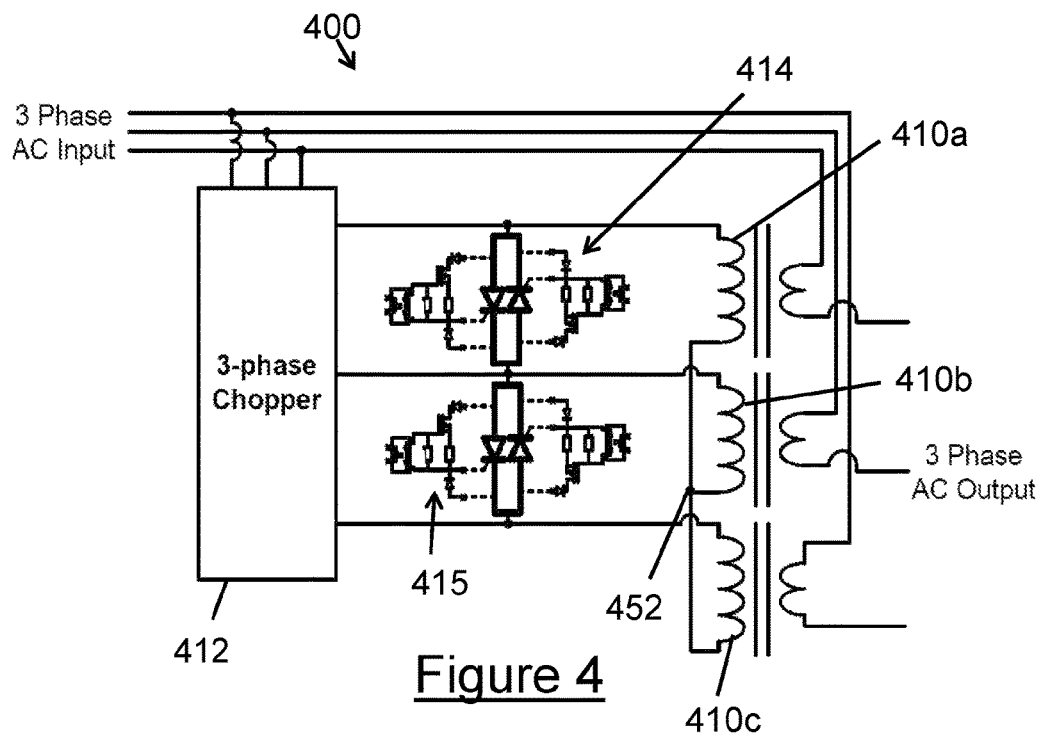
FIG. 4 illustrates a three-phase VPO circuit, which includes a controller protection circuit.

FIG. 4 illustrates a three-phase VPO circuit 400, which may also be referred to as a three-phase electronic voltage stabiliser. The VPO circuit 400 in this example includes a 3-phase chopper controller 412, which can be a 'boost' regulator or a 'buck' regulator depending upon the configuration of the transformer windings.

The three-phase VPO circuit 400 includes three input terminals, three output terminals, and three voltage regulating transformers. Each voltage regulating transformer comprises a controlled winding 410a, 410b, 410c and an output winding. Each output winding is connected in series between respective ones of the input terminals and the output terminals.

The VPO circuit 400 includes a first controlled winding 410a, a second controlled winding 410b, and a third controlled winding 410c. A first end of each of the controlled windings 410a, 410b, 410c is connected to a star point node 452. A second end of the first controlled winding 410a is connected to a first terminal of the 3-phase chopper controller 412. A second end of the second controlled winding 410b is connected to a second terminal of the 3-phase chopper controller 412. A second end of the third controlled winding 410c is connected to a third terminal of the 3-phase chopper controller 412.

It will be appreciated that each pair of transformer windings may be provided as a separate single-phase transformer, as shown in FIG. 4. Alternatively, a three-phase transformer can be used. All of the windings can be wound on a common magnetic core in the three-phase transformer.

A first controller protection circuit 414 is connected between (i) the second end of the first controlled winding 410a and (ii) the second end of the second controlled winding 410b. A second controller protection circuit 415 is connected between (i) the second end of the second controlled winding 410b and (ii) the second end of the third controlled winding 410c. That is, the first controller protection circuit 414 is connected between the first ends of a first pair of the controlled windings, and the second controller protection circuit 415 is connected between the first ends of a second, different, pair of the controlled windings. In this way, two pairs of anti-parallel thyristors can be used to short out the transformer windings in a three-phase system.

Figure 5:
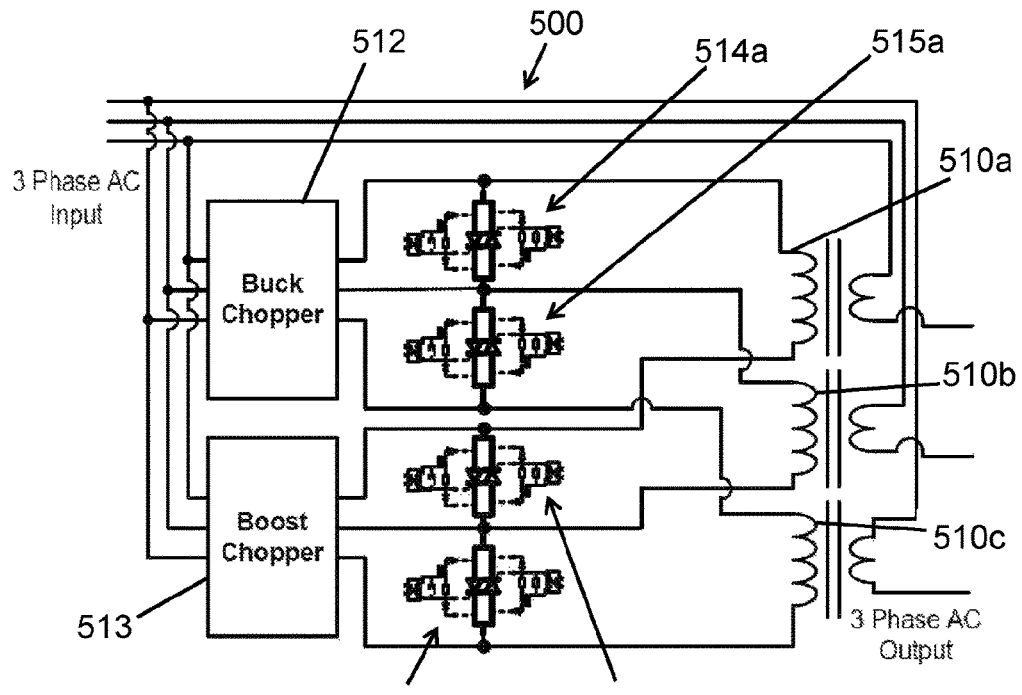
FIG. 5 illustrates a three-phase VPO circuit that provides the functionality of a 'buck-boost' voltage regulator, which includes a controller protection circuit.

FIG. 5 illustrates a three-phase VPO circuit 500 that provides the functionality of a 'buck-boost' voltage regulator. The VPO circuit 500 includes a buck chopper controller 512 and a boost chopper controller 513. The buck chopper controller 512 and the boost chopper controller 513 may together be referred to as a dual mode controller, and may individually be referred to as a first sub-controller and a second sub-controller. The VPO circuit 500 includes a first controlled winding 510a, a second controlled winding 510b, and a third controlled winding 510c. A first end of the first controlled winding 510a is connected to a first terminal of the buck chopper controller 512. A first end of the second controlled winding 510b is connected to a second terminal of the buck chopper controller 512. A first end of the third controlled winding 510c is connected to a third terminal of the buck chopper controller 512. A second end of the first controlled winding 510a is connected to a first terminal of the boost chopper controller 513. A second end of the second controlled winding 510b is connected to a second terminal of the boost chopper controller 513. A second end of the third controlled winding 510c is connected to a third terminal of the boost chopper controller 513.

The three-phase VPO circuit 500 includes:
- a first controller protection circuit 514a connected between the first ends of a first pair of the controlled windings 510a, 510b, 510c;
- a second controller protection circuit 515a connected between the first ends of a second, different, pair of the controlled windings 510a, 510b, 510c;
- a third controller protection circuit 514b connected between the second ends of a first pair of the controlled windings 510a, 510b, 510c; and
- a fourth controller protection circuit 515b connected between the second ends of a second, different, pair of the controlled windings 510a, 510b, 510c.

In this example, the first controller protection circuit 514a is connected between (i) the first end of the first controlled winding 510a and (ii) the first end of the second controlled winding 510b. The second controller protection circuit 515a is connected between (i) the first end of the second controlled winding 510b and (ii) the first end of the third controlled winding 510c. The third controller protection circuit 514b is connected between (i) the second end of the first controlled winding 510a and (ii) the second end of the second controlled winding 510b. The fourth controller protection circuit 515b is connected between (i) the second end of the second controlled winding 510b and (ii) the second end of the third controlled winding 510c.

The first controller protection circuit 514a and the second controller protection circuit 515a, including their associated pairs of anti-parallel thyristors, can be used to protect the 'buck' power electronics in the buck chopper controller 512. The third controller protection circuit 514b and the fourth controller protection circuit 515b, including their associated pairs of anti-parallel thyristors, can be used to protect the 'boost' power electronics in the boost chopper controller 513. In such a system, either the buck chopper controller 512 or the boost chopper controller will be operational dependent upon whether the input voltage is higher or lower than the desired output voltage. The unused controller 512, 513 can be used to creates a star-point (short circuit) across its associated ends of the controlled windings 510a, 510b, 510c. This can involve closing IGBTs in the appropriate controller 512, 513.

Advantageously, the thyristors associated with the controller protection circuits 514a, 515a, 514b, 515b can not only be used to provide the failsafe bypass, they can also be used to provide the 'star-point' when one of the converters is operating. Initially all thyristors are conducting, which creates two star points, one at each of the ends of the windings. The controller 512, 513 de-activates the star point at the end it wishes to control. Placing thyristors (conduction paths) between phases 1 and 2 and also phases 2 and 3 creates the start point(s). That is, the thyristors of the controller protection circuits 514a, 515a, 514b, 515b that are associated with the unused controller 512, 513 can be switched on such that they provide a short circuit between the associated ends of the controlled windings 510a, 510b, 510c. In this way, a controller can activate only one of the buck chopper controller 512 and the boost chopper controller 513 at an instant time, and wherein the inactive controller sets the gate control signal for the associated thyristors such that they are configured to conduct and thereby define a star-point between the associated ends of the controlled windings. The conduction losses of the thyristors can be significantly lower than that of IGBTs that may be present in the controllers 512, 513 and therefore using the thyristors to form the 'star-point' instead of IGBTs can reduce losses and hence improve the overall system efficiency.

Figure 6:
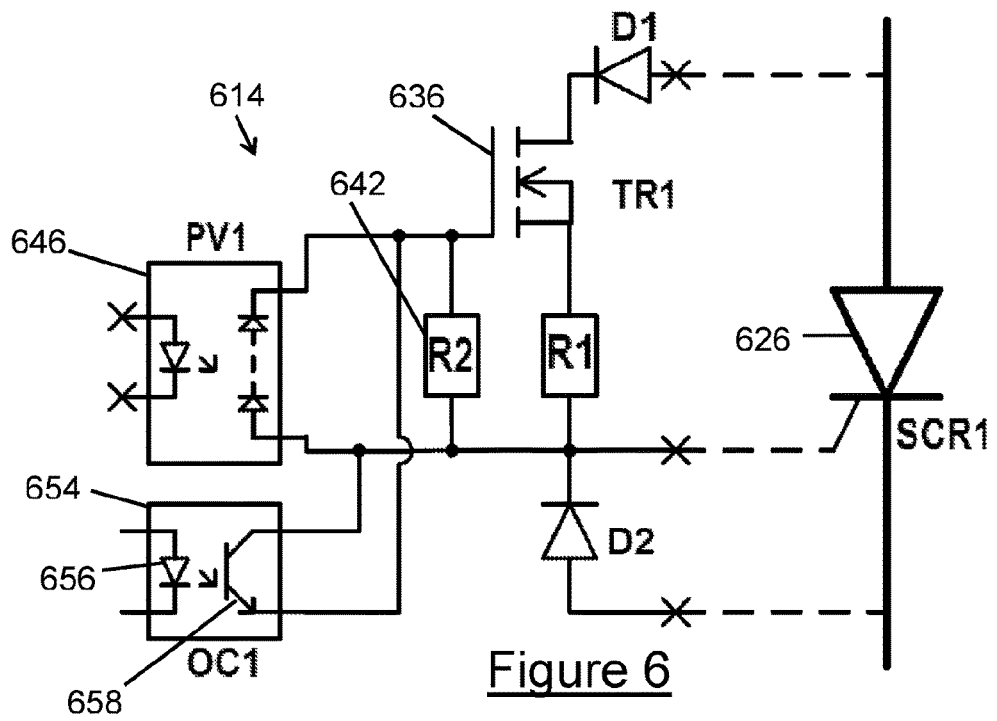
FIG. 6 shows an example of another controller protection circuit.

FIG. 6 shows an example of a controller protection circuit 614 that is similar to the circuit shown in FIG. 2. Features that have already been described with reference to FIG. 2 will not necessarily be described again here.

The controller protection circuit 614 includes an opto-coupler (OC1) 654, which comprises an LED 656 and an opto-transistor 658. The conduction channel of the opto-transistor 658 is connected in parallel with the output of the photo-voltaic isolator 646, which means that it is also in parallel with the second resistor 642. When the LED 656 emits light it is received by the opto-transistor 658, and as a consequence the opto-transistor 658 shorts the output of the photo-voltaic isolator 646. When the output of the photo-voltaic isolator 646 is shorted, the change in voltage at the gate of the MOSFET 636 causes the MOSFET 636 to be switched on and the thyristor 626 to switch back on.

The LED 656 is connected to an electronic voltage controller (not shown), such that the electronic voltage controller controls the operation of an LED 656. In a similar way to that described above with reference to FIG. 2, power electronics within an electronic voltage controller can identify an internal fault, and in response energise the LED 656 in the opto-coupler 654 in order to cause the thyristors to provide a bypass across the controlled winding. Also, the LED 656 can be activated in response to a user selecting a bypass (de-activate) mode.

Use of the opto-coupler 658 to override the operation of the photo-voltaic isolator 646 can be advantageous because the thyristor 626 can be switched on quickly. For example, a photo-transistor opto-coupler 654 such as the one shown in FIG. 6 can have a propagation delay of a micro-second or less, which can be a shorter period of time than it takes to turn off the photo-voltaic isolator 646. Therefore, energising the LED 656 in the opto-coupler 654 can cause its output transistor 658 to discharge the output of the photo-voltaic isolator 646 and hence re-enable the gate current for the thyristor 626 almost instantly.

Figure 7:
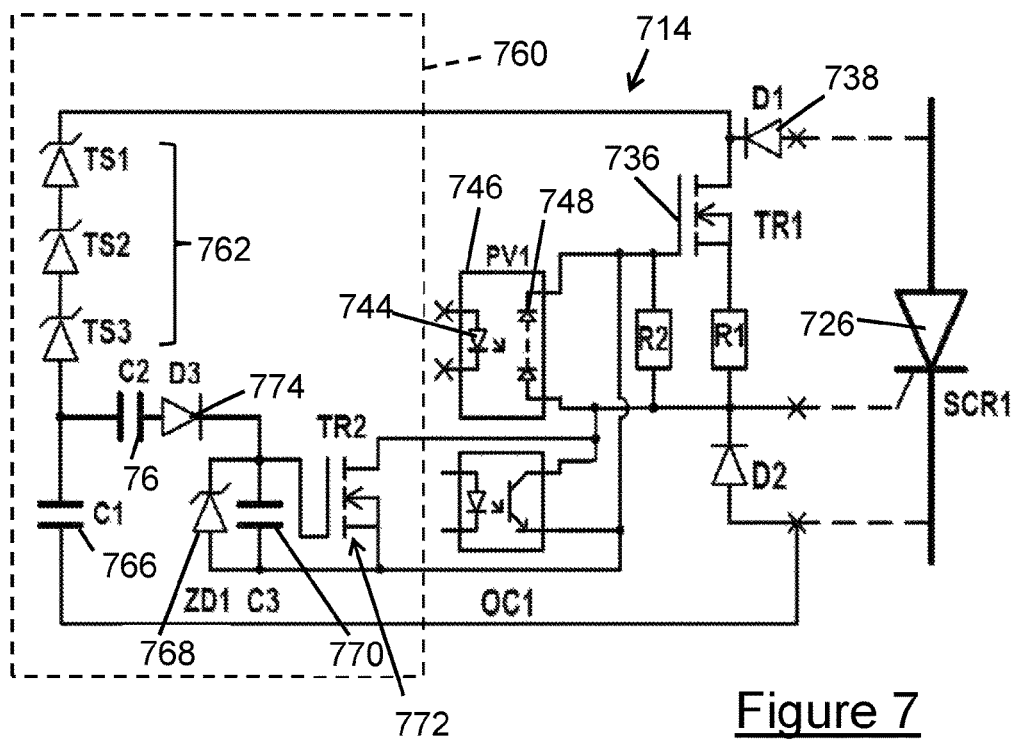
FIG. 7 shows a further example of a controller protection circuit.

FIG. 7 shows another example of a controller protection circuit 714. Features that have already been described with reference an earlier figure will not necessarily be described again here.

FIG. 7 includes a high-voltage override circuit 760 that is configured to set the gate control signal such that the thyristor 726 is switched on if the voltage across the thyristor 726 exceeds a threshold value. The high-voltage override circuit 760 may also be referred to as an over-voltage protection circuit. More particularly, in this example, the high-voltage override circuit 760 is configured to provide a short circuit across the photo-voltaic isolator 746 if the voltage across the thyristor 726 exceeds the threshold value, such that the potential difference across the thyristor 726 causes it to be switched on in the same way as described with reference to FIG. 2. In this example, the threshold value is defined by one or more transient voltage suppressors 762, as will be described in more detail below.

Commercially available IGBT's that can be used in a.c. voltage stabilisers can have a breakdown voltage of 1200V, even though the mains voltage is much lower. If a fault occurs in the power electronics of the electronic voltage controller (not shown) which causes one of the IGBTs to stop conducting, then the voltage induced in the controlled winding can rapidly rise to many kilovolts, which is more than sufficient to destroy all of the IGBTs in the system.

The high-voltage override circuit 760 of FIG. 7 provides protection against such high voltages, and includes a third diode (D3) 774, a Zener diode (ZD1) 768, a small (standard) MOSFET 772 (which is an example of a normally-off switch), a first capacitor (C1) 766, a second capacitor (C2) 764, a third capacitor (C3) 770 and the one or more transient voltage suppressors 762. The one or more transient voltage suppressors 762 together define a breakover/breakdown voltage, such that they start to conduct if they are subjected to a reverse bias voltage level that exceeds the breakover voltage. The breakover voltage level defines the threshold value, above which the high-voltage override circuit 760 causes the thyristor 726 to switch on.

The cathode connection of the transient voltage suppressors 762 is connected to the anode of the thyristor 726, in this example indirectly via the first diode 738. The anode connection of the transient voltage suppressors 762 is connected to the first plate of the first capacitor 766. The second plate of the first capacitor 766 is connected to the cathode of the thyristor 726. In this way, the potential difference across the thyristor 726 is the same as the potential difference across a series combination of the transient voltage suppressors 762 and the first capacitor 766.

The first plate of the first capacitor 766 is connected to the first plate of the second capacitor 764. The second plate of the second capacitor 764 is connected to the cathode of the third diode 774. The anode of the third diode 774 is connected to the first plate of the third capacitor 770. The first plate of the third capacitor 770 is also connected to the gate terminal of the small MOSFET 772. The second plate of the third capacitor 770 is connected to the source terminal of the small MOSFET 772. The source terminal of the small MOSFET 772 is connected to a first output terminal of the photo-voltaic isolator 746. The drain terminal of the small MOSFET 772 is connected to a second output terminal of the photo-voltaic isolator 746.

In this way, the conduction channel of the small MOSFET 772 is provided in parallel with the photodiodes 748 of the photo-voltaic isolator 746. As discussed below, the conduction channel of the small MOSFET 772 (normally-off switch) is configured to provide a short circuit across the photo-voltaic isolator 746 when the voltage across the thyristor 726 exceeds the threshold value such that the thyristor 726 is switched on.

Assume the VPO is in a normal mode of operation and the thyristor 726 is turned off because the LED 744 in the photo-voltaic isolator 746 is energised. If a system fault occurs then a high voltage can build across the anode and cathode of the thyristor 726. If the voltage across the thyristor 726 builds to a level that exceeds the breakover voltage of the transient voltage suppressors 762, then the transient voltage suppressors 762 will allow charge to flow into the first capacitor 766.

The sudden rise of voltage on the first capacitor 766 capacitively couples charge into the third capacitor 770 via the second capacitor 764 and the third diode 774. The Zener diode 768 can protect the small MOSFET 772 from excessive gate-source voltage. The third diode 774 can prevent charge from being removed from the third capacitor 770 due to voltage ringing at the junction of the first capacitor 766 and the second capacitor 764.

The charge coupled into the third capacitor 770 during the over-voltage event causes the small MOSFET 772 to conduct which disables the output of the photo-voltaic isolator 746, which in turn causes current to flow into the gate terminal of the thyristor 726 via the MOSFET 736.

In some examples, individual transient voltage suppressors may be limited to breakdown voltages up to about 350V. Therefore, an appropriate threshold level for the high-voltage protection circuit 760 can be set by utilising two or more such devices. For example, three 300V devices can be used in series to provide a fault threshold voltage level of 900V. This is well above the normal mains operating voltage (for example, 400V) but can also be well below the absolute maximum voltage rating of any IGBTs in an associated controller (for example, 1200V).

Figure 8:
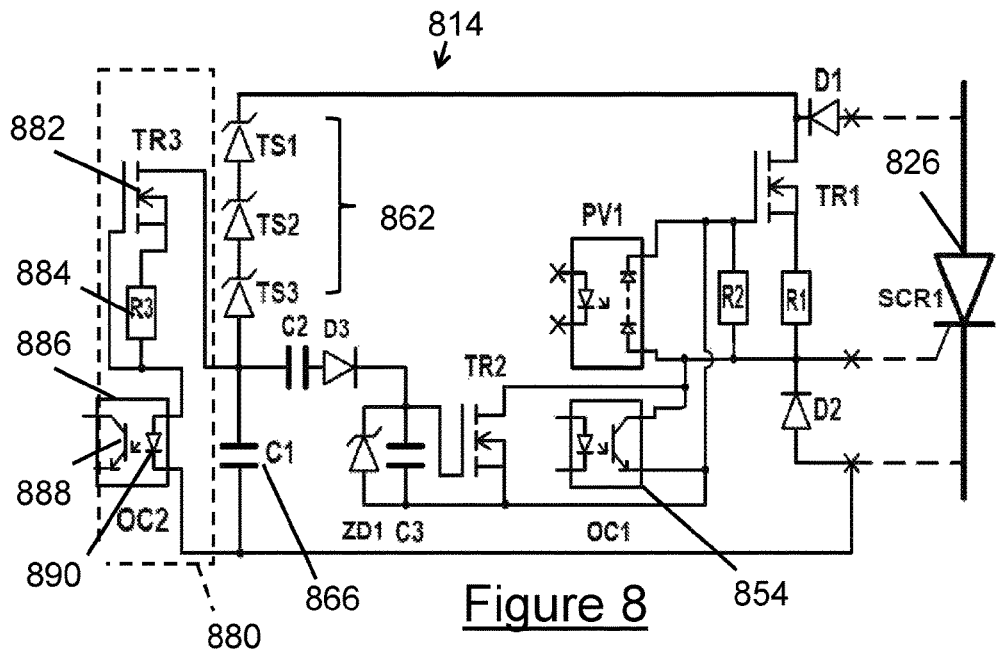
FIG. 8 shows a further still example of a controller protection circuit.

FIG. 8 shows another example of a controller protection circuit 814. Features that have already been described with reference an earlier figure will not necessarily be described again here.

FIG. 8 includes an over-voltage signalling circuit 880 that is configured to generate a warning signal in response to the high-voltage threshold level being exceeded. Such a warning signal can be sent to a controller, including the electronic voltage controller described above, or to any other component or device that can utilise or act upon such a warning signal. That is, the over-voltage signalling circuit 880 provides a means of signalling to a control system that an over-voltage condition has occurred.

The over-voltage signalling circuit 880 includes a third (depletion-mode) MOSFET 882 (which is an example of a second normally-on switch), a third resistor (R3) 884 and a second opto-coupler (OO2) 886. The second opto-coupler 886 comprises an LED 890 and an opto-transistor 888. The second opto-coupler 886 is an example of a second galvanically isolated signal transmission device The drain of the third MOSFET 882 is connected to the first plate of the first capacitor 866. The source of the third MOSFET 882 is connected to a first terminal of the third resistor 884. A second terminal of the third resistor 884 is connected to the anode of the LED 890 in the second opto-coupler 886. The second terminal of the third resistor 884 is also connected to the gate of the third MOSFET 882.

The cathode of the LED 890 in the second opto-coupler 886 is connected to the second plate of the first capacitor 866. In this way, the conduction channel of the third MOSFET 882, the third resistor 884 and the LED 890 in the second opto-coupler 886 are connected in series across the first capacitor 866.

As discussed above with reference to FIG. 7, when the transient voltage suppressors 862 breakover, charge flows into the first capacitor 866 and causes its voltage to rise suddenly. The actual voltage developed across the first capacitor 866 depends upon the duration and magnitude of the over-voltage condition. When the over-voltage condition occurs, a potential difference also builds across the series connected third MOSFET 882, third resistor 884 and LED 890 due to the charge build up on the first capacitor 866. The potential difference across the LED 890 in the second opto-coupler 886 causes light to be transmitted to the opto-transistor 888, and therefore a warning signal to be identifiable due to the change in state of the opto-transistor 888.

In this example, the third (depletion-mode) MOSFET 882 is configured as a constant current source because of its connections to the third resistor 884. The value of the third resistor 884 can be chosen based upon the pinch-off voltage of the third MOSFET 882 in order to provide adequate current to energise the LED 890 of the second opto-coupler 886. Using a constant current source can advantageously result in the current flowing in the LED 890 of the second opto-coupler 886 being constant irrespective of the magnitude of the voltage developed across the first capacitor 866 during the over-voltage event.

The second opto-coupler 886 can provide an output signal for the control system indicative of the fact that an over-voltage condition has occurred. Although the thyristor 826 will already have been re-activated via the high-voltage override circuit that has been described with reference to FIG. 7, the control system can use the warning signal to force a shutdown condition, for example to turn off the power electronics and reactivate the thyristor 826 by energising the first opto-coupler 854.

It will be appreciated that the various opto-couplers and photo-voltaic isolators disclosed herein are examples of galvanically isolated signal transmission devices, and that other galvanically isolated signal transmission devices, such as transformers, can be used instead in some examples.

It will be appreciated that any components that are described or illustrated herein as being coupled or connected could be directly or indirectly coupled or connected. That is, one or more components could be located between two components that are said to be coupled or connected whilst still enabling the required functionality to be achieved.

Examples disclosed herein that use a thyristor to provide a short circuit across a winding can be considered better than using an electromagnetic switch, because normally-closed electromagnetic switches that are capable of withstanding large currents may not be readily available. Also, the switching time of a normally-open electromagnetic switch (contactor) can be between 50-200 ms. Thus if a normally-open contactor is deployed there can be several mains cycles of current flow through the transformer at initial power on before the contacts are closed. During this time the controlled transformer winding will generate voltages sufficiently high enough to destroy any IGBT's in the converter. Therefore additional protection devices such as transorbs or metal oxide varistors may be required to limit the voltage experienced by the IGBT's whilst the contactor is closing. Examples discloses herein may not require such additional protection devices.

A faster, more reliable means of providing a short-circuit current path for the controlled winding during power on or fault condition is to use an electronic switch, which can be formed from a pair of anti-parallel thyristors. However, thyristors do not conduct until a gate voltage is applied to them so they are in effect normally-open switches also. Low-voltage gate triggers for the thyristors can be provided by a power supply fed from the converter input. However, there can be a time lag between mains power being applied to the system and the thyristor power supplies charging to their operational voltage. This can potentially leave the controlled transformer winding open to produce high voltage while the gate trigger power supplies are established. One or more of the examples disclosed herein can be considered as using a self-powered thyristor gate control circuit, and therefore can enable the thyristor to be switched on more quickly.

One or more example disclosed herein relate to a self-powered, normally closed, optically isolated control apparatus to provide a safe conduction path for transformer windings. The apparatus may be based upon a thyristor, a high-voltage depletion-mode MOSFET, and a photo-voltaic isolator. Also, a photo-coupler can be used to expedite reactivation of the thyristor. An over-voltage protection feature can be included, optionally along with a means to signal the detection of an over-voltage condition. Also disclosed is a means to implement a failsafe thyristor control apparatus to protect power electronic converters from overvoltage in a.c. voltage regulator applications.

The invention claimed is:

1. A controller protection circuit for a voltage power optimiser, the circuit comprising:
    a first terminal for connecting to a first end of a winding in the voltage power optimiser;
    a second terminal for connecting to a second end of the winding in the voltage power optimiser;
    a thyristor having an anode terminal, a cathode terminal and a gate terminal, the anode terminal is connected to the first terminal, the cathode terminal is connected to the second terminal, and the gate terminal is configured to receive a gate control signal;
    a thyristor gate control circuit configured to:
        set a gate control signal such that the thyristor is configured to conduct in response to a potential difference between the anode terminal and the cathode terminal of the thyristor; and
        set the gate control signal such that the thyristor is configured not to conduct in response to a signal received from a voltage controller;
    wherein the thyristor gate control circuit comprises:
        a normally-on switch having a conduction channel and a control terminal, the conduction channel is connected in series between the anode terminal and the gate terminal of the thyristor; and
        a galvanically isolated signal transmission device configured to set the gate control signal such that the thyristor is configured not to conduct in response to a signal received from a voltage controller.

2. The controller protection circuit of claim 1, wherein the normally on switch is a depletion mode MOSFET.

3. The controller protection circuit of claim 1, wherein the galvanically isolated signal transmission device is a photovoltaic isolator.

4. The controller protection circuit of claim 1, wherein the galvanically isolated signal transmission device is configured to provide a voltage signal to the control terminal of the normally-on switch such that:
    the normally-on switch is switched off; and
    the gate control signal is set such that the thyristor is configured not to conduct.

5. The controller protection circuit of claim 1, wherein the thyristor gate control circuit comprises a first diode and a first resistor in series with the normally-on switch between the anode terminal and the gate terminal of the thyristor.

6. The controller protection circuit of claim 5, wherein the first resistor comprises:
    a first terminal connected to the gate terminal of the thyristor; and
    a second terminal connected to the conduction channel of the normally-on switch;
    wherein the thyristor gate control circuit further comprises a second resistor,
    wherein the second resistor comprises:
        a first terminal connected to the first terminal of the first resistor; and
        a second terminal connected to the control terminal of the normally-on switch.

7. The controller protection circuit of claim 1, further comprising an opto-coupler, which comprises an LED and an opto-transistor, wherein a conduction channel of the opto-transistor is connected in parallel with an output of the galvanically isolated signal transmission device, and wherein the opto-transistor is configured to short the output of the galvanically isolated signal transmission device in response to light received from the LED.

8. The controller protection circuit of claim 1, further comprising a high-voltage override circuit configured to set the gate control signal such that the thyristor is switched on if a voltage across the thyristor exceeds a threshold value.

9. The controller protection circuit of claim 1, further comprising a normally-off switch having a conduction channel, wherein the conduction channel is connected in parallel with an output of the galvanically isolated signal transmission device, wherein the conduction channel is configured to conduct when a voltage across the thyristor exceeds a threshold value.

10. The controller protection circuit of claim 8, further comprising an over-voltage signalling circuit configured to generate a warning signal in response to the threshold value being exceeded.

11. The controller protection circuit of claim 10, wherein the over-voltage signaling circuit comprises a second galvanically isolated signal transmission device.

12. The controller protection circuit of claim 1, further comprising a second thyristor having a second anode terminal, a second cathode terminal and a second gate terminal, wherein the second anode terminal is connected to the second terminal, and the second cathode terminal is connected to the first terminal, wherein the second gate terminal is configured to receive a second gate control signal;
    a second thyristor gate control circuit, the second thyristor gate control circuit configured to:
        set the second gate control signal such that the second thyristor is configured to conduct in response to a potential difference between the second anode terminal and the second cathode terminal of the second thyristor; and
        set the second gate control signal such that the second thyristor is configured not to conduct in response to a signal received from the voltage controller.

13. A voltage power optimiser circuit, comprising:
an input terminal;
an output terminal;
a voltage regulating transformer comprising a controlled winding and an output winding, wherein the output winding is connected in series between the input terminal and the output terminal, and the controlled winding has a first end and a second end;
a controller connected to the first end and to the second end of the controlled winding; and
a controller protection circuit connected between the first end and the second end of the controlled winding, the controller protection circuit comprising a first terminal for connecting to a first end of a winding in the voltage power optimiser;
a second terminal for connecting to a second end of the winding in the voltage power optimiser;
a thyristor having an anode terminal, a cathode terminal and a gate terminal, the anode terminal is connected to the first terminal, the cathode terminal is connected to the second terminal, and the gate terminal is configured to receive a gate control signal;
a thyristor gate control circuit configured to:
set a gate control signal such that the thyristor is configured to conduct in response to a potential difference between the anode terminal and the cathode terminal of the thyristor; and
set the gate control signal such that the thyristor is configured not to conduct in response to a signal received from a voltage controller;
wherein the thyristor gate control circuit comprises:
a normally-on switch having a conduction channel and a control terminal, the conduction channel is connected in series between the anode terminal and the gate terminal of the thyristor; and
a galvanically isolated signal transmission device configured to set the gate control signal such that the thyristor is configured not to conduct in response to a signal received from a voltage controller.

14. A three-phase voltage power optimiser circuit, comprising:
three input terminals;
three output terminals;
three voltage regulating transformers, each voltage regulating transformer comprising a controlled winding and an output winding, wherein each output winding is connected in series between respective ones of the input terminals and the output terminals, and wherein each controlled winding has a first end and a second end, wherein the first ends of each of the controlled windings are connected together to form a star-point;
a controller connected to the first end of each of the controlled windings; and
a first controller protection circuit connected between the second ends of a first pair of the controlled windings; and
a second controller protection circuit connected between the second ends of a second, different, pair of the controlled windings, wherein each of the first controller protection circuit and the second controller protection circuit comprises a first terminal for connecting to a first end of a winding in the voltage power optimiser;
a second terminal for connecting to a second end of the winding in the voltage power optimiser;
a thyristor having an anode terminal a cathode terminal and a gate terminal the anode terminal is connected to the first terminal, the cathode terminal is connected to the second terminal, and the gate terminal is configured to receive a gate control signal;
a thyristor gate control circuit configured to:
set a gate control signal such that the thyristor is configured to conduct in response to a potential difference between the anode terminal and the cathode terminal of the thyristor; and
set the gate control signal such that the thyristor is configured not to conduct in response to a signal received from a voltage controller;
wherein the thyristor gate control circuit comprises:
a normally-on switch having a conduction channel and a control terminal, the conduction channel is connected in series between the anode terminal and the gate terminal of the thyristor; and
a galvanically isolated signal transmission device configured to set the gate control signal such that the thyristor is configured not to conduct in response to a signal received from a voltage controller.

15. A three-phase voltage power optimizer circuit, comprising:
three input terminals;
three output terminals
three voltage regulating transformers, each voltage regulating transformer comprising a controlled winding and an output winding, wherein each output winding is connected in series between respective ones of the input terminals and the output terminals, and wherein each controlled winding has a first end and a second end;
a dual mode controller comprising a first sub-controller and a second sub-controller, wherein the first sub-controller is connected to the first end of each of the controlled windings, and wherein the second sub-controller is connected to the second end of each of the controlled windings; and
a first controller protection circuit connected between the first ends of a first pair of the controlled windings;
a second controller protection circuit connected between the first ends of a second, different, pair of the controlled windings;
a third controller protection circuit connected between the second ends of a first pair of the controlled windings; and
a fourth controller protection circuit connected between the second ends of a second, different, pair of the controlled windings;
each of the controller protection circuits comprising a first terminal for connecting to a first end of a winding in the voltage power optimiser;
a second terminal for connecting to a second end of the winding in the voltage power optimiser;
a thyristor having an anode terminal, a cathode terminal and a gate terminal, the anode terminal is connected to the first terminal, the cathode terminal is connected to the second terminal, and the gate terminal is configured to receive a gate control signal;
a thyristor gate control circuit configured to:
set a gate control signal such that the thyristor is configured to conduct in response to a potential difference between the anode terminal and the cathode terminal of the thyristor; and
set the gate control signal such that the thyristor is configured not to conduct in response to a signal received from a voltage controller;

wherein the thyristor gate control circuit comprises:
- a normally-on switch having a conduction channel and a control terminal, the conduction channel is connected in series between the anode terminal and the gate terminal of the thyristor; and
- a galvanically isolated signal transmission device configured to set the gate control signal such that the thyristor is configured not to conduct in response to a signal received from a voltage controller.

16. The three-phase voltage power optimiser circuit of claim 15, wherein the dual mode controller is configured to activate only one of the first sub-controller and the second sub-controller at an instant time, and wherein the inactive sub-controller is configured to set the gate control signal for the associated thyristors such that they are configured to conduct and thereby define a star-point between the associated ends of the controlled windings.

17. The three-phase voltage power optimiser circuit of claim 15, wherein the first sub-controller is a buck chopper controller, and the second sub-controller is a boost chopper controller.

* * * * *